US010068968B2

(12) United States Patent
Jordan et al.

(10) Patent No.: US 10,068,968 B2
(45) Date of Patent: *Sep. 4, 2018

(54) $B_xC_yN_z$ NANOTUBE FORMATION VIA THE PRESSURIZED VAPOR/CONDENSER METHOD

(75) Inventors: Kevin Jordan, Newport News, VA (US); R. Roy Whitney, Newport News, VA (US); Michael W Smith, Newport News, VA (US); Jae-Woo Kim, Newport News, VA (US); Cheol Park, Yorktown, VA (US)

(73) Assignee: JEFFERSON SCIENCE ASSOCIATES, LLC, Newport News, VA (US)

( * ) Notice: Subject to any disclaimer, the term of this patent is extended or adjusted under 35 U.S.C. 154(b) by 579 days.

This patent is subject to a terminal disclaimer.

(21) Appl. No.: 13/200,314

(22) Filed: Sep. 22, 2011

(65) Prior Publication Data

US 2012/0171487 A1 Jul. 5, 2012

Related U.S. Application Data

(60) Provisional application No. 61/460,533, filed on Jan. 4, 2011.

(51) Int. Cl.
*H01L 29/06* (2006.01)
*B01J 19/12* (2006.01)
(Continued)

(52) U.S. Cl.
CPC ........ *H01L 29/0669* (2013.01); *B01J 19/121* (2013.01); *B82Y 30/00* (2013.01);
(Continued)

(58) Field of Classification Search
CPC ................ B01J 19/121; H01L 29/0669; C04B 35/6229; C04B 35/62277;
(Continued)

(56) References Cited

U.S. PATENT DOCUMENTS 4,895,628 A * 1/1990 Knudsen et al. ........ 204/157.45
6,231,980 B1 5/2001 Cohen et al.
(Continued)

FOREIGN PATENT DOCUMENTS

CN 1608976 A * 4/2005

OTHER PUBLICATIONS

Zhang et al, "Heterogeneous growth of B-C-N nanotubes by laser ablation," Chem. Phys. Lett. 279, pp. 264-269 (Nov. 21, 1997).*
(Continued)

*Primary Examiner* — Nicholas A Smith
*Assistant Examiner* — Colleen M Raphael

(57) ABSTRACT

Nanotube filaments comprising carbon, boron and nitrogen of the general formula $B_xC_yN_z$, having high-aspect ratio and high-crystallinity produced by a pressurized vapor/condenser method and a process of production. The process comprises thermally exciting a boron-containing target in a chamber containing a carbon source and nitrogen at a pressure which is elevated above atmospheric pressure.

6 Claims, 5 Drawing Sheets

(51) Int. Cl.
    *C04B 35/622*     (2006.01)
    *C01B 21/06*     (2006.01)
    *B82Y 30/00*     (2011.01)
    *C01B 35/14*     (2006.01)
    *B82Y 40/00*     (2011.01)

(52) U.S. Cl.
CPC .......... *C01B 21/0602* (2013.01); *C01B 35/14* (2013.01); *C04B 35/6229* (2013.01); *C04B 35/62277* (2013.01); *C04B 35/62286* (2013.01); *B82Y 40/00* (2013.01); *C01P 2002/01* (2013.01); *C01P 2004/03* (2013.01); *C01P 2004/04* (2013.01); *C01P 2004/13* (2013.01); *C04B 2235/421* (2013.01); *C04B 2235/422* (2013.01); *C04B 2235/526* (2013.01); *C04B 2235/5284* (2013.01); *Y10T 428/298* (2015.01)

(58) Field of Classification Search
CPC ........ C04B 35/62286; C04B 2235/421; C04B 2235/526; C04B 2235/422; C04B 2235/5284; C01B 21/0602; C01B 35/14; C01P 2002/01; C01P 2004/04; C01P 2004/03; C01P 2004/13; B82Y 40/00
USPC ............ 204/157.41, 157.45, 157.46, 157.47; 977/901, 896
See application file for complete search history.

(56) References Cited

U.S. PATENT DOCUMENTS

| | | | |
|---|---|---|---|
| 6,855,301 B1 * | 2/2005 | Rich et al. | 204/157.41 |
| 2009/0117021 A1 | 5/2009 | Smith et al. | |
| 2010/0192535 A1 | 8/2010 | Smith et al. | |
| 2012/0325648 A1 * | 12/2012 | Reis et al. | 422/186 |
| 2013/0064750 A1 * | 3/2013 | Zettl | 977/896 |

OTHER PUBLICATIONS

CN 200410064768 (or CN 1608976A) machine translation.*

Han et al, "Formation of Boron Nitride (BN) Fullerene-Like Nanoparticles and (BN)xCy Nanotubes Using Carbon Nanotubes as Templates," Jpn. J. Appl. Phys. vol. 38 (1999), pp. L755-L757, Part 2, No. 7A, Jul. 1, 1999.*
Dorozhkin et al, "Field emission from individual B-C-N nanotube rope," Appl. Phys. Lett. vol. 81, No. 6, Aug. 5, 2002, pp. 1083-1085.*
Maser et al, "Elaboration and characterization of various carbon nanostructures," Synthetic Metals 81 (1996), pp. 243-250.*
Suenaga et al, "Synthesis of nanoparticles and nanotubes with well-separated layers of boron nitride and carbon," Science 278, 653 (1997).*
Suenaga et al, "Organisation of carbon and boron nitride layers in mixed nanoparticles and nanotubes synthesized by arc discharge," Appl. Phys. A 68, 301-208 (1999).*
Kuz'min et al, "Formation of boron carbonitride and nitride nanoparticles in electric arc evaporation of reactants," Izvestiya Vysshiki Uchebnykh Zavedenii, Khimiya i Khimicheskaya Tekhnologiya vol. 52, issue 3, pp. 23-26 (2009) (English abstract provided).*
Suenaga, EELS diagnoses of the multi-phase nanotubes and nanoparticles in the B-C-N ternary system, Hyomen Kagaku (2000), 21, (9), 560-568.*
Smith, M.W. Et Al., Very Long single-and Few-walled Boron nitride Nanotubes Via the Pressurized Vapor/condenser Method; Nanotechnology 20 (2009) 505604.
Ma, Renzhi et al., Synthesis and Properties of B-C-N and BN Nanostructure, Phil. Tran.:Math., Phys. and Eng. Sciences, vol. 362, No. 1823, (Oct. 15, 2004), pp. 2161-2186.
Goldberg, Dmitri et al., Nanotubes in Boron Nitride Laser Heated at High Pressure, Appl. Phys. Lett. 69 (14), Sep. 30, 1996, 2045-2047.
Goldberg, Dmitri et al., Boron Nitride Nanotubes, Adv. Mater., 2007, 19, 2413-2434.
Zhi, Chunyi et al., Effective Precursor for High Yield Synthesis of Pure BN Nanotubes, Solid State Communications 135 (2005) 67-70.
Bansal, Narottam et al., Boron Nitride Nanotubes-Reinforced Glass Composites, NASA/TM 2005-213874, Aug. 2005.

* cited by examiner

$B_xC_yN_z$ NANOTUBE FORMATION VIA THE PRESSURIZED VAPOR/CONDENSER METHOD

This application claims the benefit of U.S. Provisional Application No. 61/460,533 filed on Jan. 4, 2011 for $B_xC_yN_z$ Nanotube Formation Via the Pressurized Vapor/Condenser Method incorporated herein by reference in its entirety.

The United States government may have certain rights to this invention under National Aeronautics and Space Administration and/or Management and Operating Contract No. DE-AC05-06OR23177 from the Department of Energy.

FIELD OF THE INVENTION

The invention relates generally to the production of nanostructures in particular to the formation of boron carbon nitride ($B_xC_yN_z$) nanotube fibers or filaments.

BACKGROUND

Since the announcement of the successful synthesis of high-aspect-ratio-few-walled boron nitride nanotubes (FW-BNNTs) in 1995, little progress had been made until very recently in the scale-up of their synthesis. In spite of the theoretical capabilities of FW-BNNTs to provide high strength-to weight, high temperature resistance, piezo actuation, and radiation shielding (via the boron content), the aerospace industry has had to rely on micron-sized graphite or boron fibers for structural applications. Further, despite their very desirable properties, neither FW-BNNTs nor single wall carbon nanotubes are used widely in aerospace manufacturing and similar industries, as industry is generally unwilling to pay the premium price for these high performance materials.

Prior to recent inventions of the present inventors, high-aspect ratio FW-BNNTs had only been produced in small amounts (from individual tubes to milligrams) by arc-discharge or laser heating methods. Further, these small amounts of FW-BNNTs were in the form of films not strands or fibers several centimeters in length. A separate class of boron nitride nanotubes known in the prior art has been produced by chemical vapor deposition or ball-milling. In ball-milling, finely-milled precursor powders of boron and catalyst are annealed in an $N_2$ or ammonia gas atmosphere, sprouting nanostructures on their surfaces. (See Narottam P. Bansal, Janet B. Hurst, and Sung R. Choi, NASA/TM-2005-213874). In chemical vapor deposition, a Boron-containing vapor, for example $B_2O_2$, reacts with a nitrogen-containing gas, such as ammonia, for example, to deposit nanostructures on a substrate placed in a furnace. (See Chunyi Zhi, Yoshio Bando, Chengchun Tan and Dmitri Golberg, *Solid State Communications*, 2005, 135, 67.) These tubes are of large diameter, do not exhibit continuous crystalline sp2-type bonding structure which has drawn most theoretical interest, and are not strands or fibers.

The Inventors' recent work in the field of boron nitride nanotubes is described in three US. Patent Applications. Inventors' U.S. patent application Ser. No. 12/152,414 filed May 14, 2008 and incorporated herein by reference in its entirety describes a process for the production of at least centimeter-long boron nitride nanotube strands or fibers. Inventors' U.S. patent application Ser. No. 12/322,591 filed Feb. 4, 2009 and incorporated herein by reference in its entirety describes an apparatus for production of boron nitride nanotubes and a method of continuous removal of the formed boron nitride nanotubes from the synthesis chamber. Inventors' U.S. patent application Ser. No. 12/387,703 filed May 6, 2009 and incorporated herein by reference in its entirety describes a method for production of fibrils and yarns.

Boron nitride nanotubes and carbon nanotubes have several very different physical properties. Boron nitride nanotubes have electrical insulating properties while carbon nanotubes are valued for their electrical conducting properties. Additionally, carbon nanotubes and boron nitride nanotubes have different structural properties, with carbon having a propensity for closing across the end of the tube to form a "buckyball" type structure and boron nitride being more inclined to a tube structure.

Ma et al. (Syntheses and Properties of B—C—N and BN Nanostructures, Renzhi Ma, Dmitri Golberg, Yoshio Bando and Takayoshi Sasaki, Philosophical Transactions: Mathematical, Physical and Engineering Sciences, Vol. 362, No. 1823, Nanotechnology of Carbon and Related Materials (Oct. 15, 2004), pp. 2161-2186) describe multi-element B—C—N systems such as $BN_2$, $BC_2N$, $BC_3$, and $CN_x$. However these systems lack crystallinity and sp2 bonding.

Accordingly, a high-aspect ratio boron-carbon-nitrogen nanostructure with a high crystallinity would be highly desirable. Additionally, boron-carbon-nitrogen nanostructures are highly desirable as they are believed to have the potential to be useful semiconductors.

SUMMARY OF INVENTION

The invention provides nanotube filaments comprising carbon, boron and nitrogen of the general formula $B_xC_yN_z$ wherein the filaments are high-aspect ratio, high-crystallinity carbon nitrogen nanotubes of the general formula $B_xC_yN_z$. In some embodiment the carbon, boron and nitrogen filaments of the general formula $B_xC_yN_z$ are at least 1 centimeter in length.

The invention also provides a process for producing boron carbon nitrogen nanotube filaments of the general formula $B_xC_yN_z$. The process comprises thermally exciting a boron-containing target in a chamber containing a carbon source and nitrogen at a pressure which is elevated above atmospheric pressure. In one embodiment the boron containing target is thermally excited by a laser. The boron-containing target may be selected from the group consisting of compressed boron powder, solid boron, compressed boron powder and carbon, compressed boron nitride powder, compressed boron nitride powder and carbon, and mixtures thereof.

Optionally, the carbon source may comprise a carbon rich gas.

The process for producing boron carbon nitrogen nanotube filaments of the general formula $B_xC_yN_z$, includes steps comprising: creating a source of boron vapor; mixing the boron vapor with nitrogen and vaporized carbon so that a mixture of boron vapor and nitrogen and vaporized carbon is present at a filament nucleation site, the nitrogen being provided at a pressure elevated above atmospheric; and harvesting boron carbon nitride nanotube fibers, which are formed at the filament nucleation site.

The vaporized carbon may be obtained from a source selected from the group consisting of solid carbon, carbon rich gases and mixtures thereof.

In embodiments in which the source of carbon vapor is solid carbon, the pressure of the nitrogen is greater than about 2 atmospheres and less than about 2000 atmospheres and preferably about 2 to about 250 atmospheres, and in some embodiments about 2 to about 12 atmospheres. In embodiments in which the source of vaporized carbon comprises carbon rich gas, the pressure of the nitrogen is greater than about 2 atmospheres and less than about 2000 atmospheres and preferably about 2 to about 250 atmospheres, and in some embodiments about 2 to about 12 atmospheres.

In one embodiment the solid boron target comprises boron and carbon and a laser beam provides the thermal energy to create a stream of boron vapor and vaporized carbon by laser heating the solid boron-containing target. The stream of boron vapor and vaporized carbon thus formed is allowed to flow from the solid boron containing target toward a filament nucleation site and contact nitrogen which is kept under pressure in a synthesis chamber enclosing the solid boron-containing target and containing the nitrogen under pressure.

In one embodiment the laser beam provides the thermal energy to create a stream of boron vapor by laser heating the solid boron-containing target. The stream of boron vapor is allowed to flow from the solid boron containing target toward the filament nucleation site and contact nitrogen and a carbon rich gas mixture which is kept under pressure in a synthesis chamber enclosing the solid boron-containing target and containing the nitrogen and carbon rich gas mixture under pressure.

In one embodiment the laser beam provides the thermal energy to create a stream of boron vapor by laser heating the solid boron-containing target. The stream of boron vapor is allowed to flow from the solid boron containing target toward the filament nucleation site, mix with carbon, and contact nitrogen which is kept under pressure in a synthesis chamber enclosing the solid boron-containing target and containing the nitrogen and carbon rich gas mixture under pressure.

In one embodiment the boron vapor has a stream of flow, and the boron carbon nitrogen nanotubes of the general formula $B_xC_yN_z$ attach to at the filament nucleation site forming boron carbon nitride nanotube filaments of the general formula $B_xC_yN_z$, the filaments propagating away there from in the direction of flow of the stream of boron vapor.

DETAILED DESCRIPTION OF THE INVENTION

Figure 1:
FIG. 1 is a high-resolution TEM microscopic image of $B_xC_yN_z$ nanotube filaments of the invention.

The generation of very long single- and few-walled boron nitride nanotubes (BNNT) has been demonstrated via a pressurized vapor/condenser method. (See Inventors' U.S. patent application Ser. No. 12/152,414 incorporated herein by reference in its entirety.) In the pressurized vapor/condenser method few walled boron nitride nanotubes fibers grow continuously by surface nucleation from seemingly arbitrary asperities at a high linear rate (many cm per sec) in the line of flow of vaporized boron mixed with nitrogen under elevated pressures.

Boron nitride nanotubes have electrical insulating properties in contrast to carbon nanotubes which are electrical conductors. This means that boron nanotubes with insulting properties have very different potential applications than carbon nanotubes which conduct. Accordingly, nanotubes which combine boron nitride with carbon are of considerable interest because of their potential as semiconductors. Further prior to the work of present inventors nanotube material has typically been formed as films in which individual structures are a few millimeters in size at most. Thus, not only would a semiconductor nanotube material be desirable, but if it could be formed in filaments or fibers, it would be particularly adaptable to incorporation in manufactured goods.

The inventors describe herein their invention of nanotube filaments comprising carbon, boron and nitrogen of the general formula $B_xC_yN_z$ ($B_xC_yN_z$ nanotubes) and of a process for forming $B_xC_yN_z$ nanotube filaments. The $B_xC_yN_z$ nanotubes of the present invention have a high-aspect ratio and a high crystallinity. Namely, the $B_xC_yN_z$ nanotubes have walls that are continuous, parallel, substantially defect-free and sp2 bonded. The nanotube fibers are formed via a process in which hot boron vapor flows into a mixture of nitrogen and vaporized carbon held in a synthesis chamber at an elevated pressure. The hot boron vapor flows through the mixture of nitrogen and vaporized carbon towards a filament nucleation site.

The $B_xC_yN_z$ nanotubes form at a filament nucleation site. A very small portion of the $B_xC_yN_z$ nanotubes may attach to a surface other than another $B_xC_yN_z$ nanotube at the filament nucleation site but most the $B_xC_yN_z$ nanotubes attach to $B_xC_yN_z$ nanotubes at the filament nucleation site and boron carbon nitride nanotube filaments of the general formula $B_xC_yN_z$ propagate away there from in the direction of flow of the stream of boron vapor. Unlike in prior art in which layers of tubes are typically formed over a surface, only a very small portion of the $B_xC_yN_z$ nanotube material actually attaches to a surface other than a $B_xC_yN_z$ nanotube material at the filament nucleation site, most of the material attaches to $B_xC_yN_z$ nanotubes to build filaments often more that one centimeter in length. In one embodiment, preferably less than about 1% of the $B_xC_yN_z$ nanotube material and more preferably less than about 0.5% of the $B_xC_yN_z$ nanotube material attaches directly a surface other than another $B_xC_yN_z$ nanotube at the filament nucleation site.

As used herein a "$B_xC_yN_z$ nanotubes filament" means a fiber, bundle, fibril or strand. In a preferred embodiment, the $B_xC_yN_z$ nanotubes filaments are at least a centimeter long. When it is being formed the $B_xC_yN_z$ nanotubes may appear as a "streamers" to the naked eye because they extend outward and follow the flow of the hot boron vapor in the synthesis chamber and have sufficient length to have a flapping motion similar to a kite tail in the wind. In some embodiments, particularly in one in which the filament nucleation site is moved during the synthesis process, the streamers may intertwine to give a material that has a web like appearance.

As used herein a "filament nucleation site" is the site where $B_xC_yN_z$ nanotube filaments form. It may comprise a structure such as a ring, a mesh, or a wire(s) for example, which provides an attachment point where a very small portion of the $B_xC_yN_z$ nanotubes may attach to a surface other than another $B_xC_yN_z$ nanotube or it may comprise a formed $B_xC_yN_z$ nanotubes or filaments which provides an attachment point for other $B_xC_yN_z$ nanotubes. Boron carbon nitride nanotube filaments of the general formula $B_xC_yN_z$ propagate away from the filament nucleation site in the direction of flow of the stream of boron vapor and gases. The filament nucleation site the is in the flow path of the hot boron vapor, but it should have a form and/or position that only minimally impacts the flow of the hot boron vapor and gases.

In one embodiment the $B_xC_yN_z$ nanotubes of the invention are formed in a synthesis chamber. The process of forming $B_xC_yN_z$ nanotubes comprises providing a boron containing target, thermally exciting the boron-containing target to create hot boron vapor and mixing the hot boron vapor with a mixture of nitrogen and vaporized carbon at a pressure which is elevated above atmospheric pressure.

In one embodiment carbon powder may be included in the boron containing target and the vaporized carbon formed as the target is thermally excited. Alternatively, in another embodiment a carbon rich gas may be introduced into the synthesis chamber either directly or admixed with nitrogen and the vaporized carbon formed as the carbon rich gas is exposed to the hot vaporized boron. In another embodiment, carbon is added to the hot boron vapor by injecting it directly into the hot boron vapor plume and vaporizing the carbon in the plume. The hot boron vapor flows in the direction of a filament nucleation site as it mixes with the mixture of nitrogen and vaporized carbon. In embodiments in which carbon is added to the hot boron vapor by injecting it directly into the hot boron vapor plume, it may be desirable to inject the carbon near or in the general vicinity of the filament nucleation site. Alternatively, in another embodiment, the carbon source may comprise solid carbon introduced into the system deposited on or coated on a structure such as a wire or a structure associated with the filament nucleation site. The structure should be positioned to provide for vaporizing of the carbon and mixing with the hot boron vapor plume and the nitrogen under pressure.

Only a very small portion of the BxCyNz nanotube material actually attaches to a surface other than $B_xC_yN_z$ nanotubes at the filament nucleation site. Most of the $B_xC_yN_z$ material attaches to $B_xC_yN_z$ nanotubes to build filaments often more that one centimeter in length. In one embodiment, preferably less than about 1% of the BxCyNz nanotube material and more preferably less than about 0.5% of the BxCyNz nanotube material attaches directly a surface other than another $B_xC_yN_z$ nanotube proximate the filament nucleation site. Boron carbon nitride nanotube filaments of the general formula $B_xC_yN_z$. propagate from these attachments by more $B_xC_yN_z$ adding to $B_xC_yN_z$ nanotube filaments. The thus formed $B_xC_yN_z$ nanotube filaments extend away from the filament nucleation site and in the direction of flow of the stream of boron vapor.

The filament nucleation site may have one of many configurations and positions so long as the plume of hot boron vapor has contact with nitrogen, which is flowing toward the filament nucleation site. Further, the form and/or position of the filament nucleation site preferably only minimally impacts the flow of the hot boron vapor so that the hot boron vapor and nitrogen pass by any filament nucleation site structure with substantially unimpeded flow. Filament nucleation sites which have been describe for boron nitride nanotube fibers are likewise suitable for $B_xC_yN_z$ nanotube filaments.

Exemplary filament nucleation sites include, but are not limited to, a rotating cooled condenser ring as described in the Inventors' U.S. patent application Ser. No. 12/322,591 incorporated herein by reference in its entirety; and an upper periphery of the solid boron target as described in the Inventors' U.S. patent application Ser. No. 12/152,414 (U.S. published application 2009/0117021) incorporated herein by reference in its entirety. The Ser. No. 12/152,414 application discloses a laser beam directed toward the solid-boron containing target and allowing the laser beam to drill a hole in the solid boron-containing target as the plume of vaporized boron is formed. The upper periphery of the hole thus formed in the solid boron-containing target may act as the filament nucleation site. Many other configurations may likewise be suitable so long as the hot boron vapor has contact with nitrogen and vaporized carbon, is flowing toward the filament nucleation site and the form and/or position of the filament nucleation site only minimally impacts the flow of the hot boron vapor so that most of the hot boron vapor passes by any filament nucleation site structure unimpeded.

Further, the inventors believe, without wishing to be bound to the theory, that no chemical catalyst and/or catalytic surface is needed to initiate the formation of the $B_xC_yN_z$ nanotube fibers. The $B_xC_yN_z$ nanotube fibers appear to form spontaneously and continuously by propagation outward (root growth) from the initial point of attachment on a suitable surface structure or $B_xC_yN_z$ nanotube material when hot boron vapor, vaporized carbon and nitrogen are present. This renders the Inventors' process fundamentally less complicated than carbon nanotube production in which a gas-borne cloud or coated surface of catalytic particles must be produced and kept active during the growth process. Accordingly, unlike for carbon nanotubes, the Inventors' production of $B_xC_yN_z$ nanotube fibers is readily amendable to continuous production of material. Further the Inventors' process typically yields fibers which are at least a centimeter in length and which are highly desirable for commercial applications.

The boron-containing target may be compressed boron powder, solid boron, compressed boron powder and carbon, compressed boron nitride powder, compressed boron nitride powder and carbon, and mixtures thereof, for example. The term "boron-containing target" should be taken to mean a solid target that comprises boron and/or a boron compound and that may also include other materials as well, in particular it may include carbon and or carbon compounds. Carbon suitable for use in a target in combination with boron or boron nitride or injected directly into the hot born vapor includes but is not limited to carbon fibers, powdered carbon (carbon black) and graphite. A used herein when "carbon" is used to describe a material used in a target or injected directly into the boron vapor, it should be taken to mean a solid material composed substantially of carbon. When boron and carbon are used in the target, the target should be constructed such that the boron and carbon are released simultaneously. The boron target is thermally excited sufficiently to form atomic boron vapor. In targets containing carbon as well as boron, both the boron and carbon are vaporized.

Typically a temperature of at least about 3200 to 4000° C. is needed to create the hot boron vapor. Lasers including free electron lasers, fiber lasers, solid state lasers, and gas lasers including carbon dioxide lasers are exemplary of suitable sources of energy for the thermal excitation and vaporization of boron. In one exemplary embodiment a 1.6 micron wavelength, 8 mm diameter, unfocused 1 kW, beam from a free electron laser propagated vertically downward into the target is suitable. In another exemplary embodiment a 2 kW $CO_2$ laser having a wavelength of about 10.6 microns and a beam width of about 12 mm is suitable. These examples are provided for illustrative purposes any many other types of laser and/or other parameters may likewise be suitable.

While lasers are suitable for heating the solid boron-containing target and creating the hot boron vapor, other methods of heating may be likewise suitable such as, for example, RF induction heating or hydrogen-oxygen flame. The method of heating preferably provides focused thermal energy.

Optionally, it may be desirable to use a boron target that is continually fed into the field of the laser beam as such an arrangement may facilitate forming fibers of greater length and/or enhance the production rate of nanotube material from the apparatus.

In embodiments in which the carbon source is solid carbon included in the target or carbon is injected directly into the boron vapor plume, nitrogen gas is introduced into the synthesis chamber. Preferably the nitrogen is fed into the chamber at a small flow rate so that a the pressure of the nitrogen is greater than about 2 atmospheres and less than about 2000 atmospheres and preferably about 2 to about 250 atmospheres, and in some embodiments about 2 to about 12 atmospheres.

In embodiments in which no solid carbon or only a portion of the desired amount of carbon is included in the solid target or injected directly, nitrogen and carbon rich gas are introduced into the synthesis chamber. Preferably the gases are fed into the chamber at a small flow rate so that the combined pressure of the nitrogen gas and the carbon rich gas is greater than about 2 atmospheres and less than about 2000 atmospheres and preferably about 2 to about 250 atmospheres, and in some embodiments about 2 to about 12 atmospheres. The nitrogen and carbon rich gas may be mixed prior to admission into the synthesis chamber or admitted individually and allowed to mix in the synthesis chamber. Suitable carbon rich gases include, but are not limited to hydrocarbons such as methane, ethane, ethylene, acetylene substituted acetylenes, propane, propene; aromatic hydrocarbons such as benzene toluene, xylene, aniline; polyaromatic hydrocarbons and combinations thereof.

Optionally, multiple types of carbon rich gases can be introduced simultaneously into the synthesis chamber or alternatively a combination of one or more carbon rich gases and solid carbon included in the target and/or injected into the boron vapor may be used a carbon source. The inventors believe without wishing to be bound to the theory, that while carbon rich gas molecules dissociate in the presence of the hot boron vapor some residual or partially dissociated carbon rich gas may be present in the synthesis chamber as well. Using a combination of carbon rich gases and solid carbon in the target may provide the advantage of having fully atomized carbon vaporized from the target for forming $B_xC_yN_z$ filaments while providing residual or partially dissociated carbon rich gas which may attach to or embed in the nanotube fibers as the nanotube fibers cool and modify the chemical, physical, and/or chemical properties of the $B_xC_yN_z$ filaments.

The specific compositional empirical formula of $B_xC_yN_z$ filaments can be varied by adjusting the relative amounts of boron, carbon and nitrogen. As a practical matter in some embodiments, adjustment of the amount of carbon both in actual amount introduced into the synthesis chamber as a solid component of the target, carbon injected directly into the boron vapor, a carbon rich gas, a mixture of carbon rich gases or a combination thereof as well as type or types of source of carbon may be a convenient way in which to obtain a filament with a specific $B_xC_yN_z$ compositional empirical formula. When a carbon rich gas is used, the proportion used is readily controlled by regulating the fractional pressure of the carbon rich gas in the nitrogen carbon rich gas mixture.

The ability to prepare a filament having a specific compositional empirical formula is highly desirable as the chemical, physical, and/or electronic properties of the $B_xC_yN_z$ filaments very with specific empirical formula. As $B_xC_yN_z$ filaments have semiconductor properties, the ability to adjust the specific empirical formula would allow for preparing filaments with desired properties for specific uses.

$B_xC_yN_z$ nanotube filaments having high-aspect ratio, high-crystallinity-bonding structures are formed. The $B_xC_yN_z$ nanotubes have walls that are continuous, parallel, substantially defect-free and sp2 bonded. In some embodiments $B_xC_yN_z$ filaments of at least about 1 cm in length are formed. In other embodiments, $B_xC_yN_z$ filaments of a length of at least about 4 centimeters or more may be formed. In some embodiments $B_xC_yN_z$, nanotube filaments may be formed at a rate of at least about 10 cm/sec. This rate is compatible with production for commercial applications.

Figure 2:
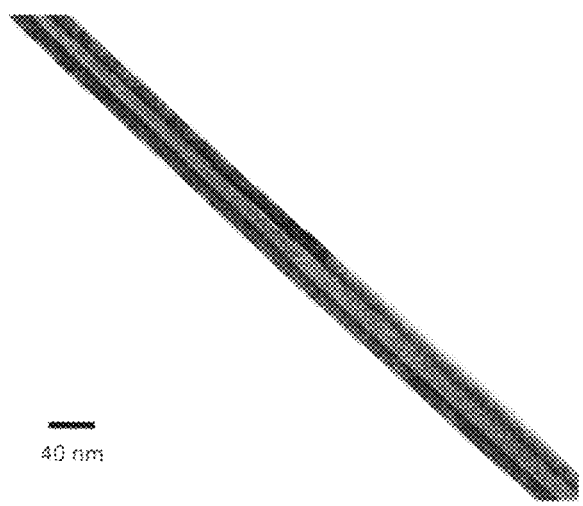
FIG. 2 is a high-resolution transmission scanning electron microscopic image of a $B_xC_yN_z$ nanotube filaments of the invention.
Figure 3:
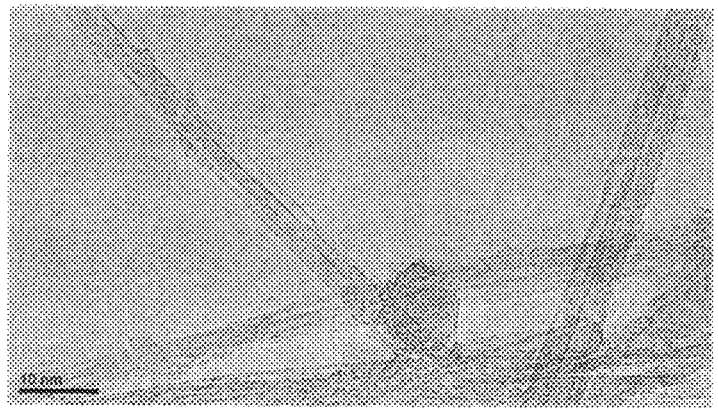
FIG. 3 is a TEM microscopic image of highly crystalline $B_xC_yN_z$ nanotube filaments of the invention.
Figure 4:
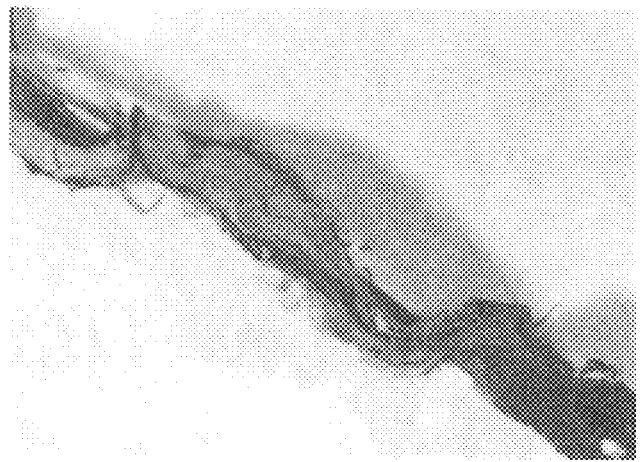
FIG. 4 shows an optical microscopic image of $B_xC_yN_z$ nanotube fibers of the invention.

The $B_xC_yN_z$ nanotube filaments were assessed morphologically by high-resolution electron microscopy and high-resolution transmission scanning electron microscopy. FIGS. 1, 2, 3 are exemplary high-resolution TEM microscopic images of $B_xC_yN_z$ nanotube filaments of the invention. As FIG. 1-3 show highly crystalline, high aspect ratio, thin walled $B_xC_yN_z$ nanotubes were formed. FIG. 4 is an optical microscope image of $B_xC_yN_z$ nanotubes fibers attached to a filament nucleation site structure.

Figure 5:
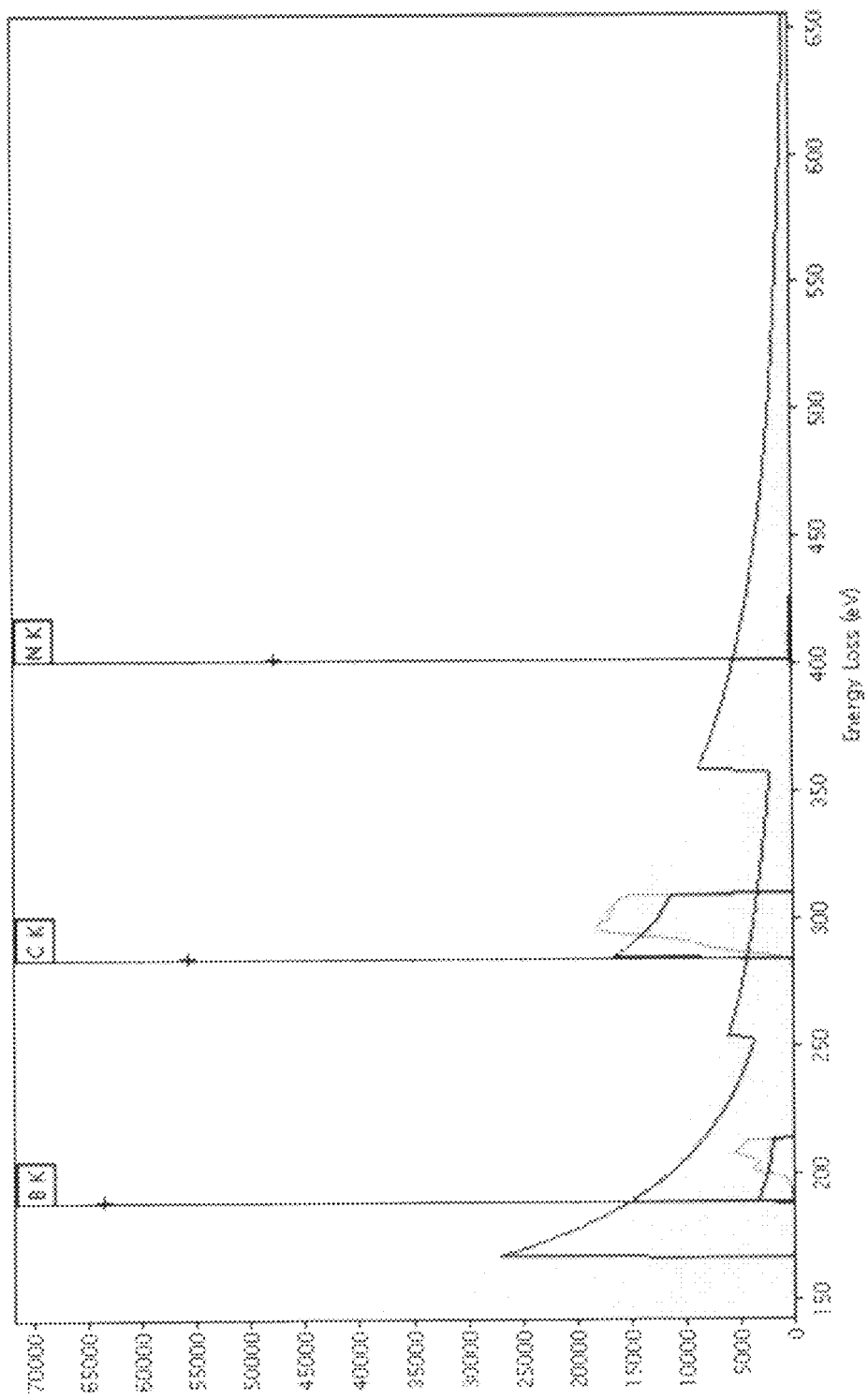
FIG. 5 is an electron energy loss spectrum (EELS) of the $B_xC_yN_z$ nanotube filaments of the invention.
Figure 6:
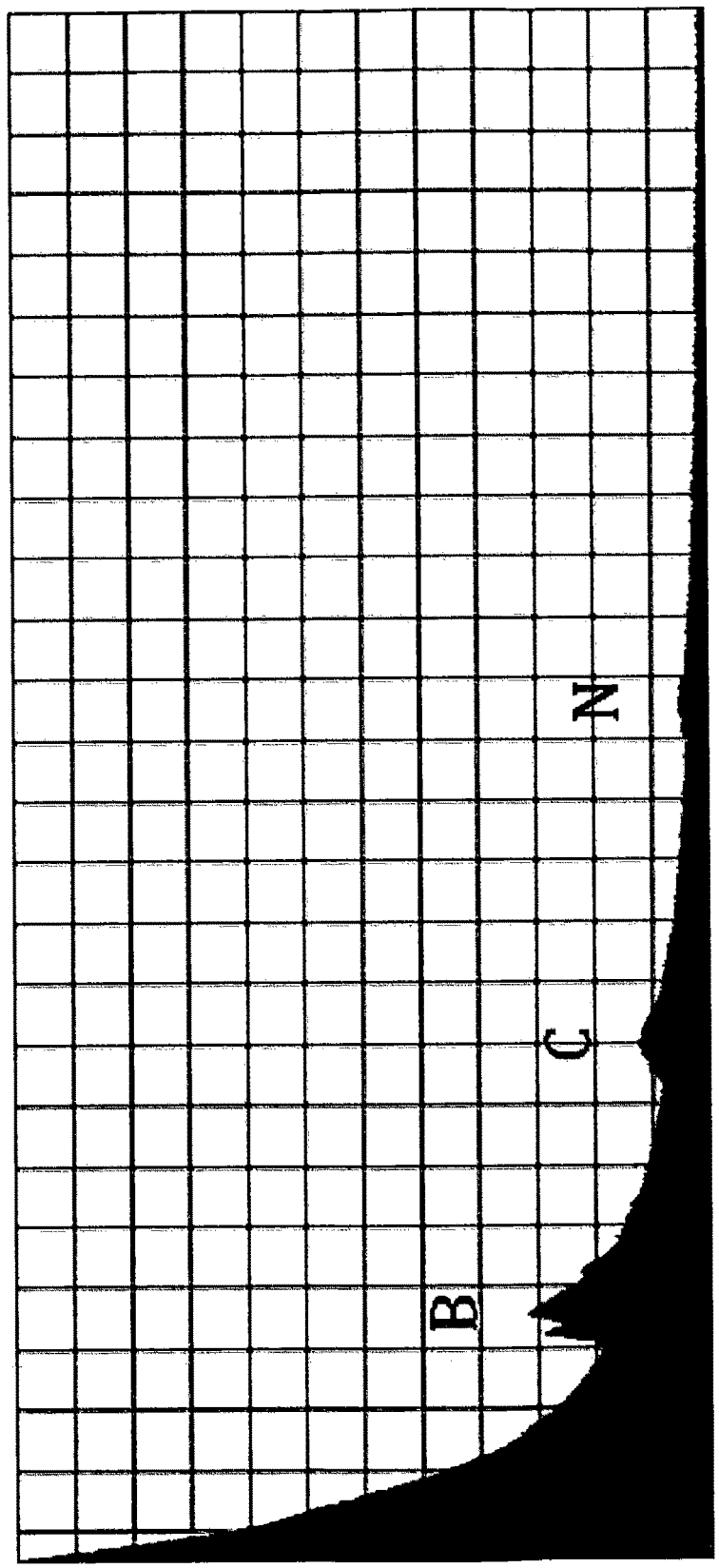
FIG. 6 is an electron energy loss spectrum (EELS) of the $B_xC_yN_z$ nanotube filaments of the invention.
Figure 7:
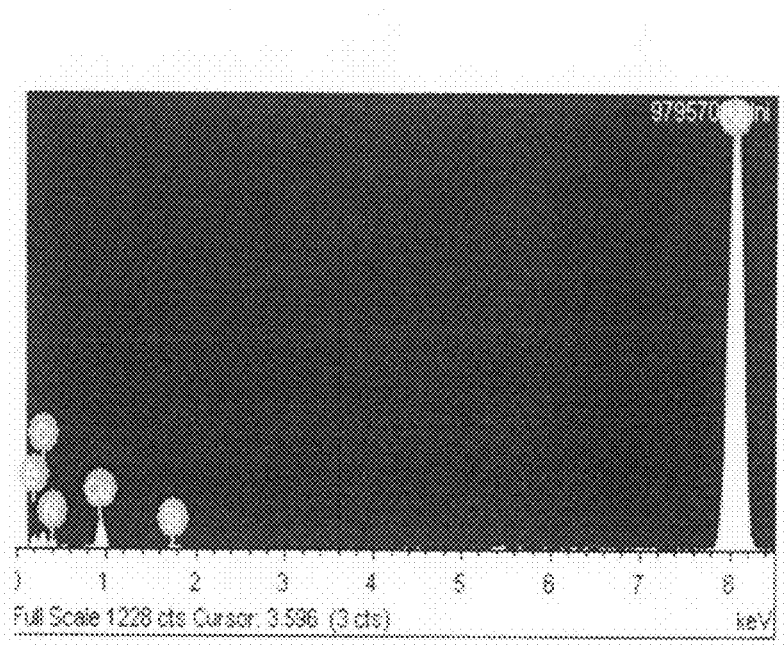
FIG. 7 is an EDS Spectrum of the $B_xC_yN_z$ nanotube filaments of the invention.
Figure 8:
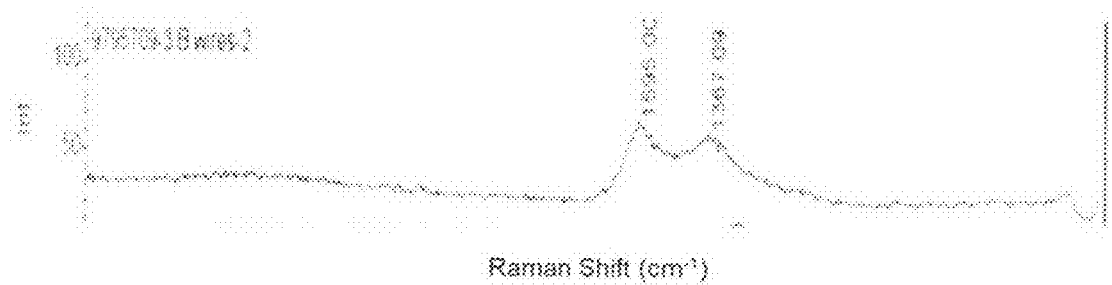
FIG. 8 is a Raman spectrum of the $B_xC_yN_z$ nanotube filaments of the invention.

The $B_xC_yN_z$ nanotube filaments were characterized compositionally using electron diffraction spectroscopy (EDS), energy loss spectrum (EELS), and Raman spectroscopy. FIGS. 5 and 6 are exemplary EELS Spectra of $B_xC_yN_z$ nanotube filaments of the invention showing the distinct K-edge peaks which indicated the presence of boron, carbon and nitrogen. The EELS spectra provides both qualitative and quantitative data. Quantitative data was obtained by integrating spectra from the boron K edge (188 eV), carbon K edge (284 eV) and nitrogen K edge (414 eV). FIG. 7 is an exemplary EDS spectrum of $B_xC_yN_z$ nanotubes of the invention showing the presence of boron, carbon and nitrogen and providing quantitative data. FIG. 8 is an exemplary Raman spectrum of $B_xC_yN_z$ nanotube filaments of the invention. The Raman spectrum exhibits both C—C tangential and B—N tangential peaks around 1595 and 1367 cm$^{-1}$, respectively.

Anyone of several methods may be suitable for harvesting the formed $B_xC_yN_z$ nanotube filaments. For example, once formed the $B_xC_yN_z$ filaments can be removed in a continuous process such as "vacuuming" them from the filament nucleation site in the synthesis chamber in a process such as the one described in Inventors' U.S. patent application Ser. No. 12/322,591, incorporated herein by reference. Alternatively the $B_xC_yN_z$ filaments may be collected in the synthesis chamber and remove when the synthesis is halted/ended. These methods of harvesting the $B_xC_yN_z$ nanotube filaments are provided for illustrative purposes and many other methods may be likewise suitable.

The inventors believe, without wishing to be bound to the theory, that when a laser heats a boron (or a boron and carbon) target to form a boron (or boron and carbon) vapor plume in the presence of nitrogen, the nitrogen is disassociated into atomic nitrogen and the $B_xC_yN_z$ nanotube fibers form at the interface between the boron (or boron and carbon) vapor and the atomic nitrogen. In the case in which solid carbon is intermixed with the boron in the target, the carbon vaporizes near the same temperature as boron and both mix in the formation. In the case in which a carbon rich gas (or gases) is used as the carbon source or a portion of the carbon source, the carbon rich gas dissociates into atomic carbon and atomic hydrogen intermixed with the atomic nitrogen. The atomic carbon joins with the atomic nitrogen and boron to form the $B_xC_yN_z$ nanotubes. Further the inventors believe, without wishing to be bound to the theory, that when carbon rich gases are used as a carbon source and they dissociate to give atomic carbon and hydrogen, the atomic hydrogen may bond onto the carbon or nitrogen in the $B_xC_yN_z$ nanotube fibers, but not typically as a part of the nanotube itself, rather as an appendage to the nanotube. Additionally the atomic hydrogen may recombine with another atomic hydrogen, boron, carbon or nitrogen atom but not as a part of a nanotube.

What is at present considered the preferred embodiment and alternative embodiments of the present invention has been shown and described herein. It will be obvious to those skilled in the art that various changes and modifications may be made therein without departing from the scope of the invention as defined by the appended claims.

What is claimed is:

1. A continuous and catalyst free process for producing high-aspect ratio, high-crystallinity boron carbon nitrogen nanotube filaments of the general formula $B_xC_yN_z$ wherein the process comprises: generating a stream of boron vapor via the thermal excitation of a boron-containing target in a chamber containing a carbon source and nitrogen at a pressure which is about 2-to about 2000 atmospheres and at a temperature of about 3200 to 4000 C; providing a filament nucleation site in the direction of flow of the stream of boron vapor; forming the boron carbon nitrogen nanotube filaments at the filament nucleation site at a rate of at least ten cm/second; and vacuuming the boron carbon nitrogen nanotube filaments from the filament nucleation site.

2. The process of claim 1 wherein the laser is selected from the group consisting of a free electron laser, a fiber laser, a solid state laser, a gas laser and a carbon dioxide laser.

3. The process of claim 1 wherein the boron-containing target is selected from the group consisting of compressed boron powder, solid boron, compressed boron powder and carbon, compressed boron nitride powder, compressed boron nitride powder and carbon, and mixtures thereof.

4. The process of claim 1 wherein the carbon source comprises a carbon rich gas.

5. The process of claim 1 further comprising providing a filament nucleation site for the formation of boron carbon nitrogen nanotube filaments of the general formula $B_xC_yN_z$.

6. The process of claim 1 wherein said boron carbon nitrogen nanotube filaments are high-aspect ratio nanotubes at least four centimeters in length.

* * * * *